June 6, 1961 R. P. ADAMS ET AL 2,987,682
MEASURING APPARATUS
Filed May 16, 1955

INVENTORS.
ROBERT P. ADAMS
WILLIAM J. POPOWSKY
BY Henry L. Hanson
ATTORNEY.

United States Patent Office 2,987,682

Patented June 6, 1961

2,987,682
MEASURING APPARATUS

Robert P. Adams, Elkins Park, and William J. Popowsky, Philadelphia, Pa., assignors to Minneapolis-Honeywell Regulator Company, Minneapolis, Minn., a corporation of Delaware Filed May 16, 1955, Ser. No. 508,704
8 Claims. (Cl. 332—31)

Figure 1:
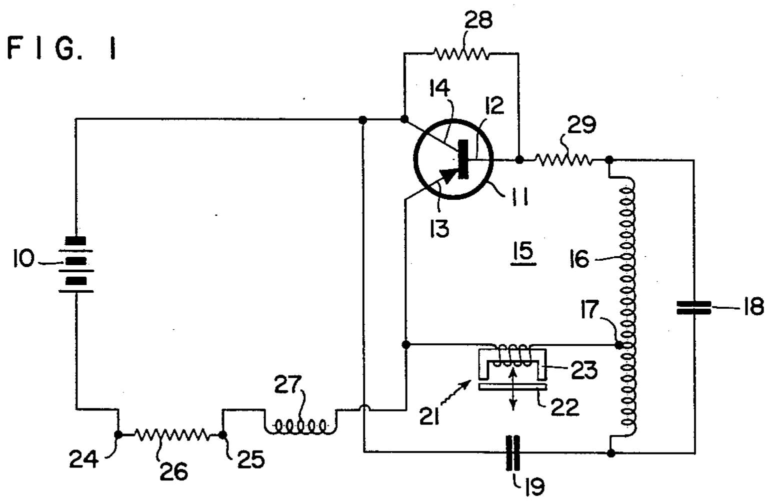

A general object of the present invention is to provide an improved transistor oscillator circuit. More specifically, the present invention is concerned with an improved transistor oscillator circuit which is characterized by its stability notwithstanding wide variations in the ambient temperature to which the oscillator circuit may be subjected.

In a copending application of William J. Popowsky, entitled "Electrical Control Apparatus," bearing Serial No. 442,264, filed July 9, 1954, there is disclosed a transistor oscillator circuit embodied in a motion to current transducer. In this Popowsky application, the intensity of oscillations of the transistor oscillator are regulated by a variable impedance, an input element of which is movable in accordance with a variable input condition. The output current of the transistor oscillator circuit is a direct current signal the magnitude of which varies proportionally with the motion of the input element.

The present invention is concerned with increasing the temperature range over which a transistor oscillator circuit such as used in the above Popowsky application may be operated.

It is accordingly a more specific object of the present invention to provide an improved motion to current transducer using a transistor oscillator circuit which has been temperature stabilized so that the circuit may be operated over a wide range of ambient temperature variations.

The initiation or starting of the oscillations in a transistor oscillator circuit are dependent in part upon the overall gain of the transistor. The transistor gain and the transistor input impedance vary with the ambient temperature to which the transistor is exposed. Thus, upon a reduction in ambient temperature, the transistor input impedance increases to such a high value and the gain decreases to such a low value that oscillations cannot be started. It has been found in that this difficulty may be overcome by adding circuit elements which will form a bias source to maintain the input impedance of the transistor, and its gain, in a range where it will maintain the control circuit in oscillation.

It is therefore a further more specific object of the present invention to provide a bias source for the transistor oscillator which will maintain the input impedance of the circuit transistor and its gain in a range which is sufficient to start circuit oscillations.

Another object of the present invention is to provide a transistor oscillator circuit wherein an electrical shunt is provided around the transistor of the circuit to provide an apparent collector current which serves with another impedance element to bias the transistor into a range where it will start circuit oscillations under varying ambient temperature conditions.

The various features of novelty which characterize the invention are pointed out with particularity in the claims annexed hereto and forming a part of the specification. For a better understanding of the invention, its advantages, and specific objects attained with its use, reference should be had to the accompanying drawings and descriptive matter in which there is illustrated and described preferred embodiments of the invention.

Figure 2:
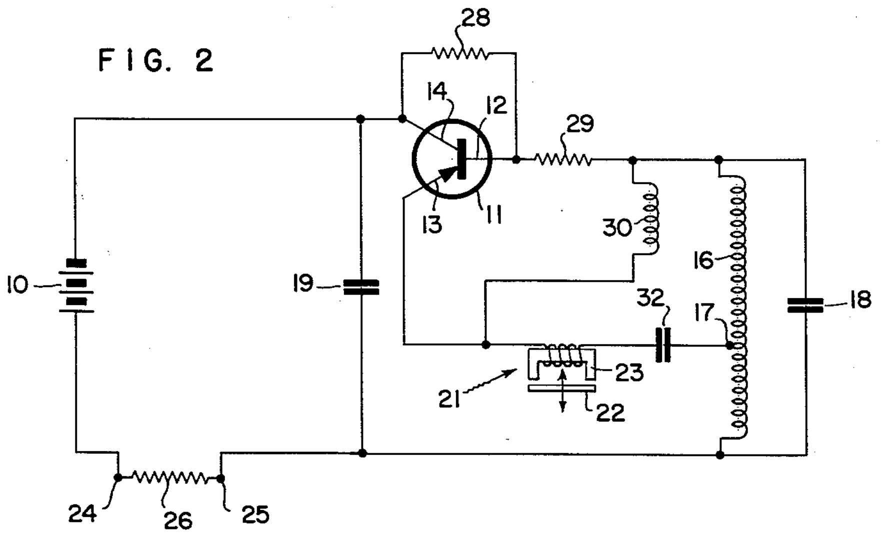

Of the drawings:

FIG. 1 shows one form of transistor oscillator circuit used in a motion to current transducer; and FIG. 2 shows a modification of the circuit of FIG. 1.

Referring first to FIG 1, the numeral 10 represents a power source which is used to supply direct current to the oscillator circuit of the present apparatus. The source 10 supplies energy to a transistor device 11 which includes a base 12, an emitter 13, and a collector 14. The transistor 11 is the amplifying device of an oscillator circuit 15. This oscillator circuit includes an inductance element 16, which is tapped at 17, and a condenser 18 connected in parallel with the end terminals of inductance element 16. The oscillator circuit also includes a coupling condenser 19 which is connected between the collector 14 and the lower terminal of the inductance element 16. A variable inductance element 21 is also part of the oscillator circuit. The inductance of this element is arranged to be varied by the movement of the movable core member 22 which varies the air gap of a core member 23.

The supply circuit connections to the transistor 11 include a pair of output terminals 24 and 25 which are shown connected to an output load impedance 26. This load impedance may well represent the input impedance of a suitable electrical signal indicator and/or controller in a manner well known in the art. In series with the terminals 24 and 25 is a choke 27 which serves to isolate the alternating current signals from the oscillator circuit 15 from the direct supply circuit.

Connected in shunt with the transistor 11 between the collector 14 and base 12 is a resistor 28. In series with the base 12 and connected between the base 12 and the upper terminal of the inductance element 16 is a further resistor 29.

In considering the operation of the circuit shown in FIG. 1, it is first assumed that the circuit is in oscillation and that the current flowing through the load impedance 26 is of a magnitude representative of the relative position of the core member 22 with respect to the core member 23. This current flow through the output load impedance 26 is a function of the intensity of the oscillations of the oscillator circuit 15 which includes the transistor 11.

The alternating current signal paths of the oscillator circuit may best be considered with respect to the input and output circuits of the transistor 11. The output circuit is assumed to be formed by the emitter 13 and collector 14 and the input circuit is formed by the base 12 and the emitter 13. The output alternating current signal may be traced from the collector electrode 14 through condenser 19, the lower part of the inductance element 16 to tap 17. From the tap 17, the signal will flow through the variable inductance device 21 to the emitter 13. The alternating current signal flowing through the lower portion of the inductance element 16 will induce a voltage across the entire inductance element so that there will be an alternating current signal appearing at the upper terminal thereof. This signal is applied in a regenerative sense to the base electrode 12 by way of the resistor 29.

The direct current circuit of the transducer apparatus may be traced from the lower terminal of the battery 10 through the load impedance 26, choke 27, to the emitter 13. From the emitter electrode 13, the current flows through the collector 14 back to the upper terminal of the battery 10. There is a further direct current circuit in the form of a voltage divider that may be traced in the oscillator circuit, insofar as the battery 10 is concerned. This may be traced from the lower terminal of the battery 10 through the load impedance 26, choke 27, impedance 21, the inductance element 16, from the tap to the upper terminal thereof, to resistor 29, and resistor 28 back to the upper terminal of the battery 10. The impedances in the last traced circuit are selected to be relatively high compared to the impedance in the emitter-collector circuit so that the current flowing in this last traced circuit may be assumed to be negligible compared to that of the emitter-collector circuit. A third circuit may be traced from the lower terminal of battery 10 through load impedance 26, choke 27, emitter 13, base 12, and resistor 28 to the upper terminal of battery 10.

When the core member 22 is moved away from the core member 23, the magnitude of the impedance 21 will decrease and there will be an accompanying increase in the intensity of the oscillations of the oscillator circuit 15. As the intensity of the oscillations increase, the magnitude of the direct current drawn through the load impedance 26 will also proportionally increase. Similarly, if the core member 22 is moved toward the core 23, the impedance of the element 21 will increase and there will be a lowering of the intensity of the oscillations of the oscillator circuit 15. This will be accompanied by a proportional change in the output direct current flowing to the load impedance 26.

The operation as described thus far is substantially the same as that in the aforementioned co-pending application of William J. Popowsky. In order to improve the temperature range and stability of the present circuit and to aid the circuit in the starting of its oscillation, particularly under conditions of low ambient temperature, the resistors 28 and 29 have been added. As the temperature of the transistor 11 decreases, the collector current referred to as $I_{co}$ decreases and the input impedance of the transistor increases. As the input impedance of the transistor increases, the loop gain of the oscillator circuit drops to a point where it is difficult to initiate oscillations in the circuit. By including the resistors 28 and 29, there are established direct current flow paths and biasing circuits from the battery 10 for transistor 11 which will produce the circuit relationships necessary to start oscillations.

In order that the transistor 11 be operative to start oscillations in the circuit, it is necessary that there be a predetermined magnitude of current flow between the emitter 13 and base 12. Under low temperature conditions, the impedance between the emitter and base goes up to a point that the circuit cannot be started in its oscillation since the current flow is too low. This current flow magnitude in this circuit may be increased by placing the resistor 28 between the base 12 and the source 10. The magnitude of this current is limited by the voltage on the source 10 and the size of the resistor 28. The resistor 29 serves to connect the A.C. feedback signal and the D.C. bias signal to the base-emitter circuit. It further prevents the base 12 from being connected directly to the positive terminal of source 10. Further, the resistor 28 must be of sufficient magnitude to prevent the shorting of the collector to base insofar as the A.C. signal is concerned. This will permit the transistor circuit to start oscillations at temperatures far below the temperatures at which the circuit will oscillate if the resistors 28 and 29 are omitted.

In the modification illustrated in FIG. 2, components common to FIGS. 1 and 2 have been designated by the same reference characters. FIG. 2 differs from FIG. 1 in respect of the addition of a choke coil 30 which is connected between the emitter 13 and one end of the resistor 29. Also, a condenser 32 is connected in series with the impedance element 21.

In the arrangement of FIG. 2, the condenser 32 is included to eliminate the flow of direct current through the impedance 21 to prevent the application of magnetic forces to the member 22 due to the presence of this direct current. In FIG. 2, the direct current output circuit may be traced from the lower terminal of the battery 10 through the output impedance 26, the inductance element 16, choke coil 30, emitter 13, and collector 14 back to the upper terminal of the battery 10.

Insofar as the alternating current circuits of this form of oscillator are concerned, the circuits may be traced from the collector 14 through condenser 19, the lower portion of the inductance element 16 to tap 17, condenser 32, impedance 21, to the emitter electrode 13. The regenerative feedback signal may be considered as being the induced voltage in the upper portion of the inductance element 16 as applied to the base by way of the resistor 29. The regenerative connection will be sufficient to maintain the circuit in oscillation so long as the gain of the transistor is high enough to sustain the oscillations.

As with FIG. 1, it is desirable for this circuit to be provided with temperature stabilization means to extend the ambient temperature range over which this circuit may be operated. The resistors 28 and 29 function in the same manner as in FIG. 1 to provide suitable bias signals and current flow paths on the input of the transistor 11 so that it will be open to start oscillations under low ambient temperature conditions. The D.C. signal path between the emitter and base in this form of the device is passed from the right end of the resistor 29 through the choke 30 to the emitter 13.

In other respects, the circuit operates in the same manner as FIG. 1 with the motion of the core member 22 relative to the core 23 producing proportional current flow changes in the output impedance 26.

From the foregoing, it will be readily apparent that in both of FIGS. 1 and 2 there has been provided a transistor oscillator circuit the temperature stability of which is extended over a wide range by virtue of the especial biasing circuits. It will be further apparent that these biasing circuits do not interfere with the overall operation of the circuit as a motion detector and that the biasing circuit incorporates a minimum of components.

While, in accordance with the provisions of the statutes, there has been illustrated and described the best forms of the embodiments of the invention known, it will be apparent to those skilled in the art that changes may be made in the forms of the invention disclosed without departing from the spirit of the invention as set forth in the appended claims and that in some cases, certain features of the invention may be used to advantage without a corresponding use of other features.

Having now described the invention, what is claimed as new and for which it is desired to secure Letters Patent is:

1. A transistor oscillator comprising a three electrode transistor device having an input circuit and an output circuit, a regenerative feedback circuit connected between said output circuit and said input circuit, a direct current bypass circuit connected to shunt two of the electrodes of said device, and a biasing resistor connected in series between one of said two electrodes and said feedback circuit.

2. A transistor oscillator circuit comprising a transistor device having an emitter, a collector, and a base, an input circuit including said emitter and base, an output circuit including said emitter and collector, a regenerative feedback connection between said output and input circuits, and an oscillator starting circuit comprising a first resistor connected directly in shunt with the base-collector path of said transistor device, and a second resistor in series between said base and said feedback connection.

3. A transistor oscillator comprising a three electrode transistor device having an input circuit and an output circuit, a regenerative feedback circuit connected between said output circuit and said input circuit, a direct current bypass circuit including a resistor connected to shunt two of said electrodes, and a biasing resistor connected in series between one of said two electrodes and said feedback circuit, said first named and biasing resistors providing a direct current bias to said transistor electrodes to condition said oscillator for oscillation.

4. A transistor oscillator comprising a three electrode transistor device having a base, an emitter and a collector, an input circuit including said base and emitter, an output circuit including said emitter and said collector, a regenerative feedback circuit connected between said output circuit and said input circuit, a direct current bypass circuit connected to shunt said base and collector, and a biasing resistor connected in series between said base and said feedback circuit, said bypass circuit and said biasing resistor forming an oscillation initiating circuit for said oscillator.

5. A transistor oscillator comprising a transistor device having a base, an emitter, and a collector, an input circuit and an output circuit, said input circuit including said emitter and base and said output including said emitter and collector, a regenerative feedback circuit connected between said output circuit and said input circuit, said feedback circuit comprising a tapped inductance element having one end connected to said collector through a condenser and the other end connected to said base through a first resistor, means connecting said emitter to a tap of said inductance, a variable impedance in said last named connection, and a direct current bypass circuit connected to shunt said collector and base, said bypass circuit comprising a second resistor which will pass current to said first resistor to produce a voltage drop thereacross to provide a circuit oscillation initiating bias.

6. A motion to current transducer comprising a variable electrical impedance whose impedance is adapted to be varied in accordance with the motion of a movable member, a transistor oscillator comprising a transistor device having a base, an emitter, and a collector, a direct current source, means connecting said source in series with the emitter-collector path of said transistor device, a regenerative feedback circuit comprising a tapped inductor connected at one end to said collector through a condenser and at the other end to said base through a first resistor, means including said variable impedance connecting the tap of said inductor to said emitter, a second resistor connected between said base and said collector, said second resistor completing a direct current biasing circuit for said transistor which includes said direct current source, said first resistor, a portion of said inductor and said variable impedance.

7. A motion to current transducer comprising a variable electrical impedance whose impedance is adapted to be varied in accordance with the motion of a movable member, a transistor oscillator comprising a transistor device having a base, an emitter, and a collector, a direct current source, means connecting said source in series with the emitter-collector path of said transistor device, a regenerative feedback circuit comprising a tapped inductor connected at one end to said collector through a first condenser and at the other end to said base through a first resistor, means including said variable impedance and a second condenser connecting the tap of said inductor to said emitter, a second resistor connected between said collector and said base, said second resistor completing a direct current biasing circuit for said transistor which includes said direct current source and said first resistor.

8. Apparatus as defined in claim 7 wherein a choke element is connected between one end of said tapped inductor and said emitter.

References Cited in the file of this patent

UNITED STATES PATENTS

| | | |
|---|---|---|
| 2,341,040 | Hathaway | Feb. 8, 1944 |
| 2,556,286 | Meacham | June 12, 1951 |
| 2,728,049 | Riddle | Dec. 20, 1955 |
| 2,750,508 | Waldhauer | June 12, 1956 |
| 2,778,942 | Ehret et al. | Jan. 22, 1957 |
| 2,853,546 | Sziklai | Sept. 23, 1958 |

FOREIGN PATENTS

| | | |
|---|---|---|
| 760,749 | Great Britain | Nov. 7, 1956 |